Figure 1:
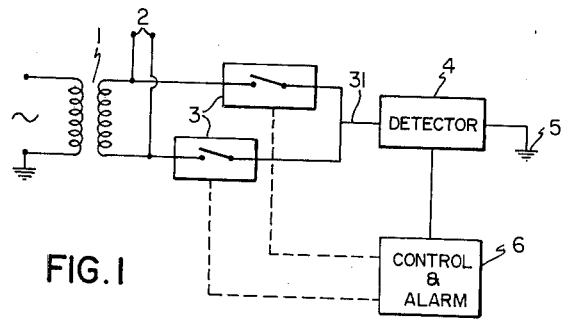

United States Patent [19]

MacMartin et al.

[11] 3,950,742

[45] Apr. 13, 1976

[54] ADJUSTABLE LINE ISOLATION MONITOR

[75] Inventors: Malcolm P. MacMartin; Norbert L. Kusters, both of Ottawa, Canada

[73] Assignee: Canadian Patents and Development Limited, Ontario, Canada

[22] Filed: Oct. 21, 1974

[21] Appl. No.: 516,149

[30] Foreign Application Priority Data

Feb. 22, 1974 Canada.................................. 193301

[52] U.S. Cl................................ 340/255; 317/18 R
[51] Int. Cl.²......................................... G08B 21/00
[58] Field of Search ..... 340/255; 324/51; 317/18 R, 317/18 D, 33 VR, 52; 323/22 T, 75 E

[56] References Cited
UNITED STATES PATENTS

| | | | |
|---|---|---|---|
| 3,066,284 | 11/1962 | McKinley et al. ................... | 340/255 |
| 3,590,322 | 6/1971 | Carr................................... | 317/52 X |

Primary Examiner—John W. Caldwell
Assistant Examiner—Daniel Myer
Attorney, Agent, or Firm—Edward Rymek

[57] ABSTRACT

A novel method and apparatus for monitoring an isolated system for ground faults which provides greater sensitivity and accuracy and at the same time does not provide a detector hazard index which would add to the fault hazard index. The monitor connects one of the lines in the isolated system to ground through a non-linear detector. The detector allows current below a predetermined level to flow freely to ground and prevents current which is above a predetermined level from flowing to ground. This is achieved by immediately disconnecting the line in question from ground, by limiting the amplitude of the ground current to the predetermined level, or both. This predetermined current level sensed may be adjusted by the operator. In addition, the monitor includes an alarm circuit which indicates the existence of an unacceptable ground fault in the isolated system.

6 Claims, 2 Drawing Figures

ADJUSTABLE LINE ISOLATION MONITOR

This invention relates to line isolation monitors and in particular to a novel method and apparatus for determining whether an electrical system, isolated from ground, has faults through which a current, having a predetermined maximum level, could flow when a low impedance connection is made between ground and one of the system's lines.

Prior art monitors are described in U.S. Pat. No. 2,999,231 which issued Sept. 5, 1961, to N. L. Kusters et al and U.S. Pat. No. 3,066,284 which issued Nov. 27, 1962 to D. W. R. McKinley et al. Improvements to these monitors are described by the present applicants M. P. MacMartin and N. L. Kusters in a co-pending application entitled Low Detector Hazard Line Isolation Monitors which was filed on the same date as the present application.

The desirable features of a Line Isolation Monitor are:

1. Equal sensitivity for all types of faults,
2. A low Detector hazard Index or one which does not increase the Total Hazard Index of the system.

These have not been totally satisified in the prior art monitors.

Prior monitors include a detector having a known linear impedance which is cyclically connected between at least one of the lines in the isolated system and ground. The monitor measures the fault hazard index of an isolated system which is defined as the current that would flow through a ground fault impedance on one line when a second line is grounded. However when the monitor is connected to the system, it provides a current path to ground through the detector and contributes a detector hazard to the system. The detector hazard index is defined as the current which would flow through the detector connected in the isolated system when one line is grounded through a low impedance. In a 120 volt system, the known impedance of the detector is such that the detector hazard index will not surpass a tolerable 1 ma. The monitor is however adjusted to signal any currents through the detector at approximately half this value since the fault impedance is in series with the detector impedance and it is desired to detect fault impedances below a tolerable 120 KΩ.

Present monitors however, have the disadvantage that when the line which is connected to the detector also has a ground fault the fault hazard index and the detector hazard index add to provide a total hazard index, and therefore by connecting the monitor to the isolated system, the total hazard may be increased above a tolerable level.

It is therefore an object of this invention to provide a novel method and apparatus for determining whether an isolated system includes faults which will allow current above a predetermined level to flow to ground if one line is connected to ground.

It is a further object of this invention to provide a method and apparatus in which the detector hazard index does not add to the fault hazard index.

It is another object of this invention to provide an apparatus which is highly sensitive to small changes in fault impedance.

It is a further object of this invention to provide an apparatus in which the level of hazard index to be detected, may be adjusted.

It is another object of this invention to provide an apparatus which is equally sensitive to balanced and unbalanced faults.

These and other objects are generally achieved by successively connecting each line of a multiline isolated system directly to ground. Any current flowing from the line to ground is prevented from rising above a predetermined level. This is achieved by immediately disconnecting the line in question from ground, by limiting the current amplitude to the predetermined level, or both.

The novel apparatus for monitoring an isolated electrical system includes a number of switches, each switch when closed connects a different line in the isolated system through a detector directly to ground. The magnitude of the current which flows through the detector to ground, when a particular switch is closed, is defined by the line voltage and the impedance of any fault which exists in the other lines. The detector exhibits a non-linear impedance to provide a substantially zero impedance when the current through the detector to ground is below a predetermined level and a high impedance when the current tends to be above the predetermined level, thus limiting the current to the predetermined level. In so doing, a voltage is developed in the detector which may be used to activate the control circuit. The detector will therefore limit current flow as well as provide a control signal to a control circuit for operating an alarm circuit which may be audio, visual or other. The control circuit, on receipt of the control signal from the detector, may also be adapted to immediately open the particular switch that is closed thus disconnecting the line from ground.

In addition, the control circuit operates the switches to connect successively each of the isolated system's lines through the detector to ground in a cyclical manner. In the preferred embodiment, each line is connected to ground through the detector for one cycle of the system voltage and the switching takes place at the beginning of a cycle when the voltage across the switch is substantially zero.

Figure 2:
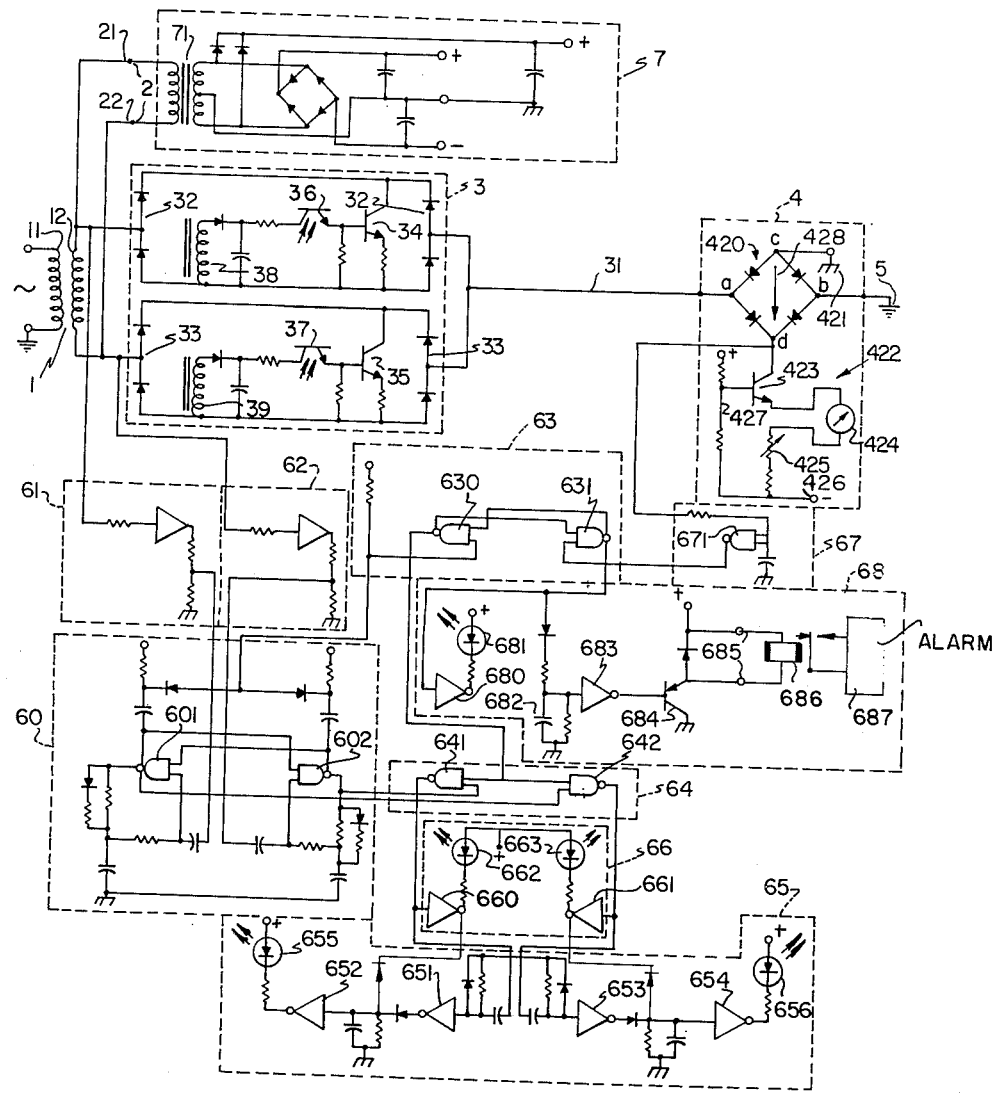

In the drawings:

FIG. 1 is a schematic diagram of the novel line isolation monitor used with an a-c isolated system; and FIG. 2 is a circuit diagram of the preferred embodiment of the adjustable line isolation monitor.

In FIG. 1, transformer 1 supplies isolation for a two-wire a-c electrical system 2 to which various non-grounded instruments may be connected. The line isolation monitor of the present invention includes switches 3, each switch cyclically closing so as to connect one of the lines in the isolated system 2 to ground 5 via line 31 and detector 4.

Detector 4 is non-linear in nature as it provides a low impedance path from switch 3 to ground to current below a predetermined level, however it also prevents current to ground from rising above the predetermined level.

Control circuit 6 operates switches 3 such that only one line is connected to the detector at any one time, and for some predetermined duration. However, control circuit 6 also receives a signal from the detector 4 when current at the predetermined level is sensed, and the control circuit opens the switch 3 which is closed, operates an alarm circuit, or both.

The detector 4 may include a simple sensing circuit which provides a signal indicating a current at the predetermined level to the control circuit 6. However, detector 4 may include a non-linear impedance which, in addition to providing a signal to control circuit 6, limits currents to ground to the predetermined level.

The above monitor provides a true indication of whether the current which would flow if one line were connected to ground through a low impedance (the Fault Hazard Index) is above or below a predetermined level, since the detector exhibits a substantially zero impedance path to ground when the current is below the predetermined level. At the same time, the detector limits this current to the level of permissible Total Hazard Index preventing excessive fault currents from flowing.

Two faults may exist in a system i.e., one fault in the line which is connected through the detector to ground, this fault will be in parallel with the detector 4, and another fault on one of the other lines which will be in series with the detector. In these circumstances, the series fault will cause a current to flow through the detector 4. If the current is below the predetermined level, the detector impedance will be essentially zero and no current will flow through the parallel fault impedance. If the current is above the predetermined level, the impedance of the detector 4 is high permitting current flow through the parallel fault impedance, however at the same time the detector 4 signals the control circuit 6 to open switch 3 and therefore the current through the detector 4 becomes zero. Thus if the detector is in parallel with a fault impedance, current may flow through the detector or the fault impedance, but not through both at the same time. Therefore the Total Hazard Index may be the Detector Hazard Index or the Fault Hazard Index, but not the sum of the two.

The preferred embodiment of the novel line isolation monitor and its operation is described in conjunction with FIG. 2.

Isolation transformer 1 has a primary winding 11 connected to a power source, such as the normal ac mains, and a secondary winding 12 connected to lines 21, 22 of a system 2 which is isolated from ground. A conventional voltage supply 7 which provides power to the line isolation monitor, is connected to system 2 such that the monitor itself will also be isolated.

Switches 3 are connected between lines 21, 22 of the isolated system and detector 4. The switches cyclically close to alternately connect lines 21 and 22 to detector 4 via line 31. In this embodiment, identical electronic switches 3 are used, each one includes a full wave diode bridge 32, 33 with a power transistor 34, 35 connected in the conventional manner. The transistor is controlled by means of a photo-coupled transistor 36, 37. Appropriate biasing for the photo-coupled transistor is obtained by means of a secondary winding 38, 39 on transformer 71 used in power supply 7. Though a particular type of semi-conductor switch is described, any other type of switch, either semi-conductor or mechanical, which will allow the flow of a-c current may be used.

Detector 4 includes a diode bridge 420 having input terminals $a$ and $b$, and output terminals $c$ and $d$. Terminal $a$ is connected to line 31, terminal $b$ is connected to ground 5 and terminal $c$ is connected to detector ground 421. Source 422 includes a transistor 423, an adjustable resistor 425 and a voltage supply terminal 426, all connected in series. A resistive voltage divider 427 is connected to the transistor base to bias it on. An ammeter 424 may be included to indicate the current through the current source.

In operation, the constant current is set at the predetermined level above which fault current is to be detected. Normally 2 ma. is considered to be the permissible total hazard index, however if desired the constant current may be adjusted by the operator by varying resistor 425 or the voltage at the base of transistor 423. The constant current flows through bridge 420 in the direction shown by arrow 428. Ammeter 424 displays the predetermined level of the constant current. If the peak value of current which flows through line 31 exceeds the set value of current displayed on meter 424, the voltage at the collector of transistor 423 rises by an amount necessary to keep the instantaneous current equal to the preset value. The control and alarm circuit is connected to terminal $d$ and is activated by this voltage rise.

Though the detector 4 described above is preferred other forms of non-linear impedance detectors or current sensing circuits may be used within the novel line isolation monitor.

The control and alarm circuits operate in two modes, the normal or no alarm mode and the fault or alarm mode.

In the normal mode, detector 4 does not provide an output voltage at $d$. In this mode, the control circuit 6 provides signals to switches 3 to connect lines 21 and 22 alternately to detector 5. This is accomplished in the following manner. Nand-gates 601 and 602 with their associated circuitry form a conventional astable, free running multivibrator 60 having a period of approximately 320 msec. Amplifiers 61 and 62 are connected between lines 21 and 22 respectively and multivibrator 60 to synchronize the multivibrator so that it will change state only when the voltage across switch 3 is zero. This prevents the generation of high amplitude transients to detector 4. One output from multivibrator 60 is connected to a bistable flip-flop 63 formed from two nand-gates 630, 631 in a manner which assures that flip-flop 63 will reset at the beginning of every half cycle of multivibrator 69. The output from nand-gate 630 is connected to one input of each of two further nand-gates 642 and 641 in a gating circuit 64. The other input to nand-gates 642 and 641 are connected to the outputs of nand-gates 601 and 602 respectively. Thus, when flip-flop 63 is reset, gating circuit 64 provides successive output signals on its two outputs which are synchronized with the multivibrator 60. The outputs from gating circuit 64 are connected to drive circuit 65. Drive circuits 65 include two pairs of inverters 651, 652 and 653, 654 with associated circuits which alternately drive photo coupled units 655, 656. The photo-coupled units are turned on for a period of approximately 16 msec. to correspond with one cycle of the isolated electrical system 2 frequency. Units 655, 656 are coupled to transistor 36 and 37 and thus at the beginning of half cycles of multivibrator 60, transistors 34 and 35 alternately connect line 21 and 22 respectively to detector 4 for approximately one cycle of the system alternating voltage.

In addition, the outputs from nand-gates 641 and 642 are connected to inverters 660, 661 respectively which each drive a light emitting diode 662, 663. These diodes thus alternately flash providing an indication that the control circuitry is operating properly.

In the alarm mode, a voltage appears at terminal $d$ of detector 4. Terminal $d$ is connected to a gating circuit 67 in which a nand-gate 671 provides an output if the voltage at *d* is above a predetermined level. The output of circuit 67 is connected to the input of nand-gate 631 in flip-flop 63 and sets flip-flop 63 until it is reset by multivibrator 60. The output of nand-gate 630 immediately reverses which as described previously with regard to gating circuit 64 and drive circuit 65, acts to open the appropriate transistor 36 or 37, thus disconnecting the corresponding line 21 or 22 from detector 4.

In addition, the output from nand-gate 631 is used to operate alarm circuits 68. A first alarm circuit includes an inverter 680 connected to nand-gate 631 which drives a light emitting diode 681. This diode will illuminate everytime flip-flop 63 is set. A second alarm circuit includes a capacitor 682 which is charged by inverter 683, during the set period of flip-flop 63, to a value which is less than that required to operate inverter 683, which controls a relay 686 connected to terminal 685 of a drive transistor 684. However, if the fault is detected for two consecutive cycles, or more, the voltage on capacitor 682 rises to a level high enough to operate inverter 683 and the relay 686 which operates an alarm 687. The alarm 687 will therefore not operate due to a non-recurring switching transient.

Though particular circuit configurations have been described in the preferred embodiment, it is within the scope of this invention to substitute these by other suitable circuits. The adjustable line isolation monitor has been described with regard to a two line isolated a-c system, however by the modification of appropriate circuitry it could be adapted to a multiline system or isolated d-c system.

We claim:

1. An apparatus for monitoring line faults to ground in an isolated a-c system having N individual lines comprising:

N bilateral switches each having an input terminal and an output terminal, the input terminal of each switch connected to one of said lines, the output terminals connected to one another;

non-linear impedance detector means having diode rectifier bridge means with first and second bridge input terminals and first and second bridge output terminals, said first bridge input terminal connected to said switch output terminals and said second bridge input terminal connected to ground, biased transistor means, a resistor and a d-c source connected in series between the first and second bridge output terminals to provide a constant current at a predetermined level to said rectifier bridge to exhibit a substantially zero impedance to currents through said detector means which are below said predetermined level and a high impedance to currents through said detector means above said predetermined level and to provide a control signal in response to current flow above said predetermined level through said detector means;

control circuit means connected to said bilateral switches, said control circuit means including: first control means adapted to close each of said bilateral switches successively for a duration T, and second control means connected to said detector means and adapted to open the bilateral switches immediately in response to said control signal; and alarm circuit means, said second control means adapted to operate said alarm in response to said control signal.

2. An apparatus for monitoring line faults to ground in an isolated system having N individual lines comprising:

N switch means each having an input termimal and an output terminal, the input terminal of each switch means connected to one of said lines, the output terminals connected to one another;

detector means connected between said output terminals and said ground, said detector means exhibiting a non-linear impedance to provide a substantially zero impedance between the output terminal and ground for currents below a predetermined level and a high impedance between the output terminal and ground for currents above said predetermined level, said detector being further adapted to generate a control signal in response to current flow to ground above said predetermined level;

control circuit means having first control means and second control means, said first control means coupled to said N switch means to successively close each of said switch means connecting each of said lines to the detector means for a duration T, said second control means coupled to said detector means to receive said control signal;

alarm circuit means, said second control means adapted to operate said alarm in response to said control signal.

3. An apparatus as claimed in claim 2 wherein said second control means is further coupled to said switch means to open said switch means in response to said control signal.

4. An apparatus as claimed in claim 2 wherein said detector means comprises:

diode rectifier bridge means having first and second bridge input terminals and first and second bridge output terminals, said first bridge input terminal connected to said switch means output terminals and said second bridge input terminal connected to ground;

biased transistor means;

a variable resistor; and a d-c source, said transistor means, variable resistor and d-c source adapted to be connected in series between the first and second bridge output terminals to provide a constant current at said predetermined level to said rectifier bridge.

5. An apparatus as claimed in claim 2 wherein the isolated system is an alternating current system having a period approximately equal to or smaller than 2T.

6. An apparatus as claimed in claim 5 wherein said control circuit means includes third control means coupled to at least one of said lines for synchronizing said first control means in phase with the alternating current system so that each of said switch means will be closed only when the voltage across the switch means is approximately zero.

* * * * *